(12) United States Patent
Kim et al.

(10) Patent No.: US 7,710,024 B2
(45) Date of Patent: May 4, 2010

(54) ORGANIC LIGHT EMITTING DISPLAY DEVICE AND METHOD OF FABRICATING THE SAME

(75) Inventors: Eun-Ah Kim, Suwon-si (KR); Joon-Young Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 444 days.

(21) Appl. No.: 11/584,375

(22) Filed: Oct. 20, 2006

(65) Prior Publication Data

US 2007/0090757 A1  Apr. 26, 2007

(30) Foreign Application Priority Data

Oct. 21, 2005  (KR) ............ 10-2005-0099836

(51) Int. Cl.
  *H01J 1/62* (2006.01)
  *H01J 63/04* (2006.01)
(52) U.S. Cl. ............ 313/506; 313/504; 445/24
(58) Field of Classification Search ......... 313/495–512; 315/169.3, 169.4; 257/40, 79; 345/30, 36, 345/44, 45; 428/690
  See application file for complete search history.

(56) References Cited

U.S. PATENT DOCUMENTS

| 6,737,800 | B1 | 5/2004 | Winters et al. |
| 2004/0099862 | A1 | 5/2004 | Suzuki et al. |
| 2004/0145303 | A1* | 7/2004 | Yamada et al. ............ 313/504 |
| 2005/0112402 | A1 | 5/2005 | Lee et al. |
| 2005/0136344 | A1* | 6/2005 | Kang et al. ............ 430/18 |
| 2006/0017377 | A1* | 1/2006 | Ryu ............ 313/504 |
| 2006/0158403 | A1* | 7/2006 | Kuma ............ 345/83 |

FOREIGN PATENT DOCUMENTS

| CN | 1543281 | 11/2004 |
| JP | 2000-323277 | 11/2000 |
| JP | 2004/014176 | 1/2004 |
| JP | 2004-127795 | 4/2004 |

OTHER PUBLICATIONS

Japanese Office action dated Jun. 16, 2009, for corresponding Japanese application 2006-286901, noting Japanese references listed in this IDS.

Chinese Patent Registration Gazette dated Aug. 12, 2009, for corresponding Chinese application 200610150673.0, noting Chinese and U.S. references listed in this IDS.

* cited by examiner

*Primary Examiner*—Toan Ton
*Assistant Examiner*—Zachary Snyder
(74) *Attorney, Agent, or Firm*—Christie, Parker & Hale, LLP

(57) ABSTRACT

An organic light emitting display device and a method of fabricating the same are provided. The device includes: a substrate having a first pixel region, a second pixel region and a third pixel region; a first electrode disposed on the substrate; an organic emission layer disposed on the first electrode; a second electrode disposed on the organic emission layer; and a first organic layer and a second organic layer disposed between the first electrode and the organic emission layer. The first organic layer and the second organic layer have a combined thickness of approximately 500 to 700 Å or approximately 2000 to 2400 Å in the first pixel region, approximately 1600 to 2000 Å in the second pixel region, and approximately 200 to 400 Å in the third pixel region.

16 Claims, 9 Drawing Sheets

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2005-0099836, filed Oct. 21, 2005, in the Korean Intellectual Property Office, the entire content of which is incorporated herein by reference.

BACKGROUND OF THE INVENTION

1. Field of the Invention

The present invention relates to light emitting display devices. More particularly, the present invention relates to an organic light emitting display device and a method of fabricating the same.

2. Description of the Related Art

The organic light emitting display device, a self-emissive display device, has an ideal structure which is thin and lightweight, made of simple components and has a simple manufacturing process. The organic light emitting display device has advantages of wide viewing angle, high picture quality, excellent display of motion pictures, high color purity, and low power consumption and low driving electric current suitable for mobile devices.

Conventional organic light emitting display devices include a substrate, a pixel electrode disposed on the substrate, an organic layer including an emission layer (EML) disposed on the pixel electrode, and a counter electrode disposed on the organic layer. The organic layer may include a hole injection layer (HIL) and a hole transport layer (HTL) disposed between the pixel electrode and the EML, and an electron transport layer (ETL) and an electron injection layer (EIL) disposed between the EML and the counter electrode.

Driving the conventional organic light emitting display device may be performed as follows. By applying electric current between the pixel electrode and the counter electrode, holes are injected from the pixel electrode into the EML via the HIL and the HTL, and electrons are injected from the counter electrode into the EML via the EIL and the ETL. The holes and electrons injected into the EML are recombined in the EML to create excitons. Light is emitted while the excitons transition from an excited state to a ground state.

In general, a conventional top emitting organic light emitting display device uses a light resonance effect so that it is important to match the thickness of the pixel electrode and the thicknesses of the HIL and HTL disposed between the EML and the pixel electrode with a possible wavelength band. The HIL enhances power consumption efficiency and the lifespan of the organic light emitting display device by facilitating the injection of holes from the pixel electrode, which is an anode. The HTL increases hole mobility and the probability of forming excitons by easily transporting holes and confining electrons to the emission region.

However, when the conventional organic layer of the organic light emitting display device is formed thinly to extend the lifespan of the device, there is a high probability of dark pixels being generated due to particles. On the other hand, when the conventional organic layer is formed thickly to reduce dark pixels, driving electric current increases while efficiency and lifespan decrease. Thus, it is difficult to form the organic layer to have an appropriate thickness.

SUMMARY

In an exemplary embodiment according to the present invention, an organic light emitting display device is provided. In the organic light emitting display device, a combined thickness of an HIL and HTL is individually controlled for each RGB sub-pixel, thereby reducing the number of dark pixels and increasing lifespan and efficiency. A method of fabricating such organic light emitting display device is also provided.

An organic light emitting display device is provided. The device includes: a substrate having a first pixel region, a second pixel region and a third pixel region; a first electrode disposed on the substrate; an organic emission layer disposed on the first electrode; a second electrode disposed on the organic emission layer; and a first organic layer and a second organic layer disposed between the first electrode and the organic emission layer. The first organic layer and the second organic layer have a combined thickness of approximately 500 to 700 Å or 2000 to 2400 Å in the first pixel region, a combined thickness of approximately 1600 to 2000 Å in the second pixel region, and a combined thickness of approximately 200 to 400 Å in the third pixel region.

In one embodiment, the first organic layer is a hole injection layer and the second organic layer is a hole transport layer.

In one embodiment, the first pixel region is adapted to display red. In one embodiment, the second pixel region is adapted to display green. In one embodiment, the third pixel region is adapted to display blue.

In another embodiment of the invention, a method of fabricating an organic light emitting display device is provided. The method includes: forming a plurality of first electrodes on a substrate; defining a first pixel region, a second pixel region and a third pixel region on the substrate; forming a first organic layer and a second organic layer, the first organic layer and the second organic layer having a combined thickness of approximately 500 to 700 Å or approximately 2000 to 2400 Å in the first pixel region, having a combined thickness of approximately 1600 to 2000 Å in the second pixel region, and having a combined thickness of approximately 200 to 400 Å in the third pixel region; forming an emission layer on the substrate on which the first pixel region, the second pixel region and the third pixel region are defined; and forming a second electrode on the emission layer.

In one embodiment, the method also includes forming at least one of a hole blocking layer, an electron transport layer or an electron injection layer on the emission layer prior to forming the second electrode.

In one embodiment, said forming the first organic layer and the second organic layer, includes: forming the first organic layer and the second organic layer in the first pixel region using a first mask; forming the first organic layer and the second organic layer in the second pixel region using a second mask; and forming the first organic layer and the second organic layer in the third pixel region using a third mask.

In one embodiment, the first organic layer is a hole injection layer and the second organic layer is a hole transport layer.

In another embodiment, said forming the first organic layer and the second organic layer, includes: disposing a first donor film having a light-heat conversion layer and a first transfer layer on the substrate; forming the first organic layer and the second organic layer in the third pixel region using a heat transfer method; disposing a second donor film having the light-heat conversion layer and a second transfer layer on the substrate; forming the first organic layer and the second organic layer in the second pixel region using the heat transfer method; disposing a third donor film having the light-heat conversion layer and a third transfer layer on the substrate; and forming the first organic layer and the second organic layer in the first pixel region using the heat transfer method.

In another embodiment, an organic light emitting display device is provided. The device includes: a substrate having a first pixel region, a second pixel region and a third pixel region; a plurality of first electrodes, each of the first electrodes being disposed on the first pixel region, the second pixel region or the third pixel region; a plurality of organic emission layers, each of the organic emission layers being disposed on a corresponding one of the first electrodes; a second electrode disposed on the organic emission layers; a first organic layer and a second organic layer having a combined thickness of approximately 500 to 700 Å or approximately 2000 to 2400 Å and disposed in the first pixel region; a third organic layer and a fourth organic layer having a combined thickness of approximately 1600 to 2000 Å and disposed in the second pixel region; and a fifth organic layer and a sixth organic layer having a combined thickness of approximately 200 to 400 Å and disposed in the third pixel region.

BRIEF DESCRIPTION OF THE DRAWINGS

The above and other features of the present invention will be described in reference to certain embodiments thereof with reference to the attached drawings, in which.

DETAILED DESCRIPTION

Figure 1A:
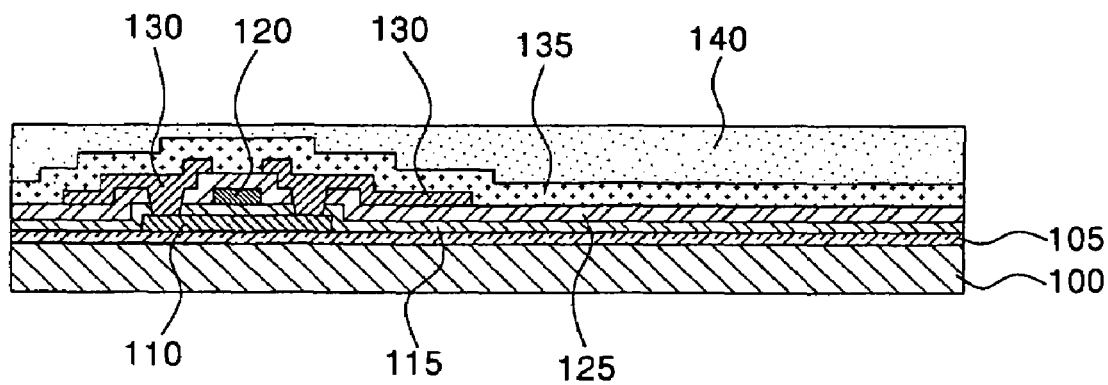
FIGS. 1A, 1B and 1C are cross-sectional views illustrating a method of fabricating an organic light emitting display device according to an exemplary embodiment of the invention.

The present invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements.

Figure 1B:
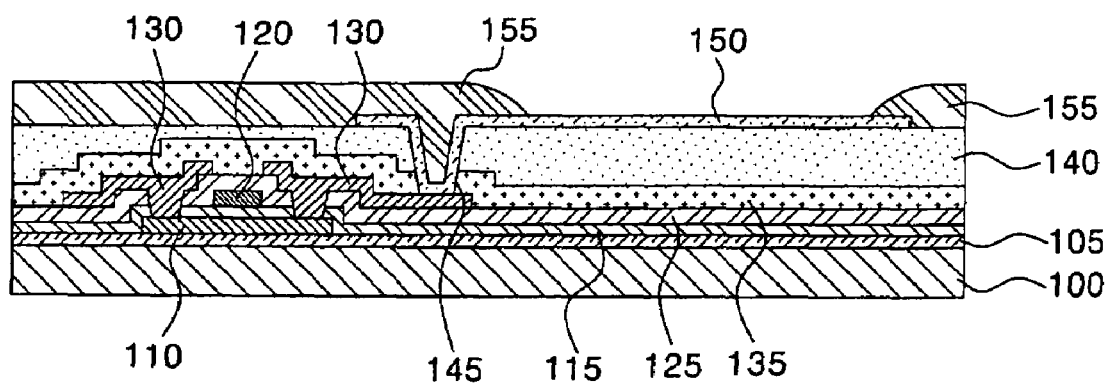
Figure 1C:
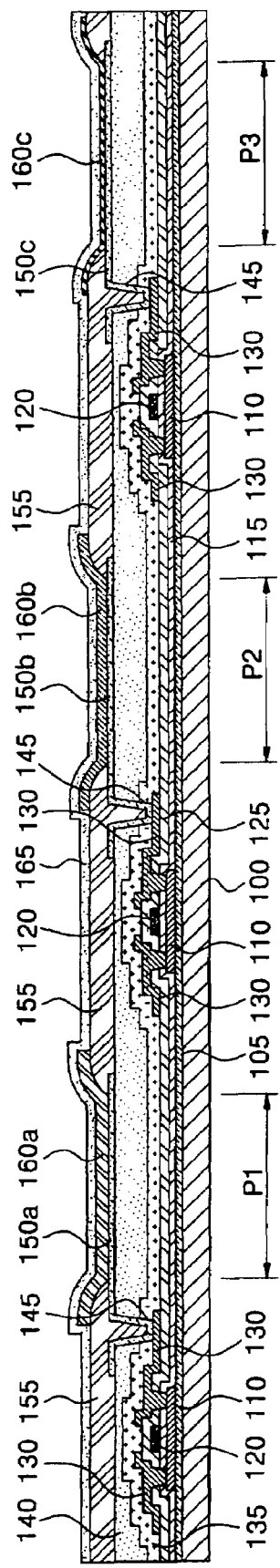

FIGS. 1A, 1B and 1C are cross-sectional views illustrating a method of fabricating an organic light emitting display device according to an exemplary embodiment of the invention.

Referring to FIG. 1A, a buffer layer 105 is disposed on a substrate 100. In some embodiments, the substrate 100 may be a transparent insulating substrate. In various embodiments, the substrate 100 may be formed of glass or plastic. Here, the buffer layer 105 inhibits diffusion of moisture and impurities generated on the substrate 100, and facilitates smooth crystallization of a semiconductor layer by controlling heat transmission speed during crystallization.

Next, a semiconductor layer 110 is formed on the buffer layer 105. Here, the semiconductor layer 110 is formed by disposing an amorphous silicon layer on the buffer layer 105, crystallizing it, and then patterning it.

Further, a gate insulator 115 is formed on the buffer layer 105 and the semiconductor layer 110. Here, the gate insulator 115 is formed of one of a silicon oxide layer, a silicon nitride layer or a composite layer thereof, using physical vapor deposition (PVD) or chemical vapor deposition (CVD).

Subsequently, a gate electrode 120 is formed by depositing a gate electrode material on the gate insulator 115 and patterning the material. Here, when the gate electrode material is patterned, at least one element among a data line, a scan line, a common power line or a capacitor electrode may be formed concurrently in a predetermined region.

Also, an interlayer insulating layer 125 is formed over the entire surface of the substrate to protect elements such as the gate electrode 120.

In addition, after contact holes exposing predetermined regions of source/drain regions of the semiconductor layer 110 are formed by etching predetermined regions of the interlayer insulating layer 125 and the gate insulator 115, source/drain electrode material is deposited on the substrate 100 and then patterned so that source and drain electrodes 130 respectively contacting the source and drain regions of the semiconductor layer 110 are formed.

Here, when the source/drain electrode material is patterned, at least one element among a data line, a scan line, a common power line or a capacitor electrode may be formed. Here, formation of the source and drain electrodes 130 completes formation of a thin film transistor. In one embodiment, the thin film transistor includes the semiconductor layer, the gate insulator, the gate electrode and the source and drain electrodes.

In addition, at least one of a passivation layer 135 or a planarization layer 140 is formed over the substrate 100. Here, the passivation layer 135 is an insulating layer adapted to protect elements disposed below the passivation layer 135, and the planarization layer 140 is an insulating layer adapted to remove a step coverage caused by elements disposed below the planarization layer 140.

Referring to FIG. 1B, a via hole 145 is formed to expose a part of the source/drain electrode 130 by partially etching the planarization layer 140 and the passivation layer 135.

Further, first electrode material is deposited on the substrate 100 and then patterned to form a first electrode 150 coupled to the source or drain electrode 130.

Here, the first electrode 150 may be formed of a transparent conductive material, for example, indium-tin oxide (ITO) or indium zinc oxide (IZO). In one embodiment, the first electrode 150 is an anode electrode. In other embodiments, the first electrode may be a cathode electrode.

Furthermore, insulating material is formed over the substrate 100 and then patterned to form a pixel defining layer 155 exposing a predetermined region of the first electrode 150. Here, the pixel defining layer 155 results in a pixel region. The pixel region is a predetermined region of the first electrode 150 that the pixel defining layer 155 exposes.

Here, referring to FIGS. 1A and 1B, the gate electrode material or the source/drain electrode material is patterned to form a scan line, a data line and a common power line. Here, one sub-pixel may be defined by forming the scan line, the data line and the common power line. A sub-pixel, the smallest unit of the organic light emitting display device, is adapted to emit red (R), green (G) or blue (B) color light. A plurality of sub-pixels are included in the organic light emitting display device.

FIG. 1C shows a unit pixel, the smallest unit of a display that is adapted to display gradation. The unit pixel includes at least three sub-pixels respectively displaying R, G and B colors.

Three pixel regions are defined by the pixel defining layers 155. The three pixel regions are a first pixel region P1, a second pixel region P2, and a third pixel region P3.

Here, the first pixel region P1 may include an organic layer 160a including an organic EML adapted to display R disposed on a first electrode 150a. The second pixel region P2 may include an organic layer 160b including an organic EML adapted to display G disposed on a first electrode 150b. And, the third pixel region P3 may include an organic layer 160c including an organic EML adapted to display B disposed on a first electrode 150c.

Here, a second electrode 165 is formed on the first pixel region, the second pixel region and the third pixel region P1, P2, P3 that are included in one unit pixel. In one embodiment, the second electrode 165 is a cathode electrode. In other embodiments, the second electrode may be an anode electrode. The organic light emitting display device can be completed by forming a plurality of such unit pixels.

Figure 2A:
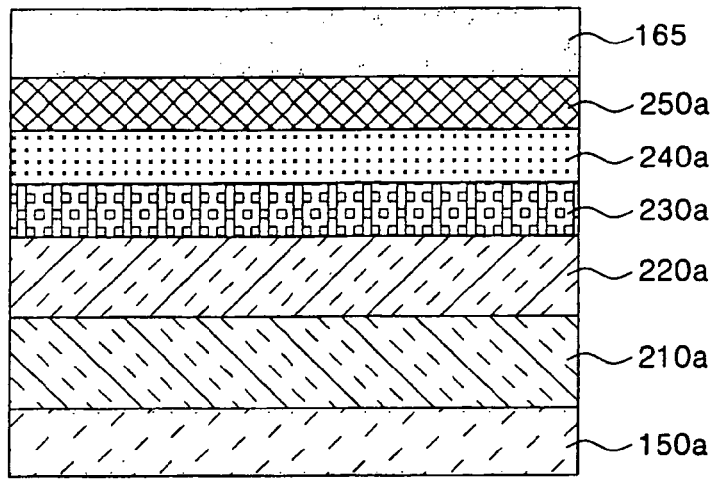
FIGS. 2A, 2B and 2C are schematic cross-sectional views illustrating structures formed on a pixel region of each unit pixel.
Figure 2B:
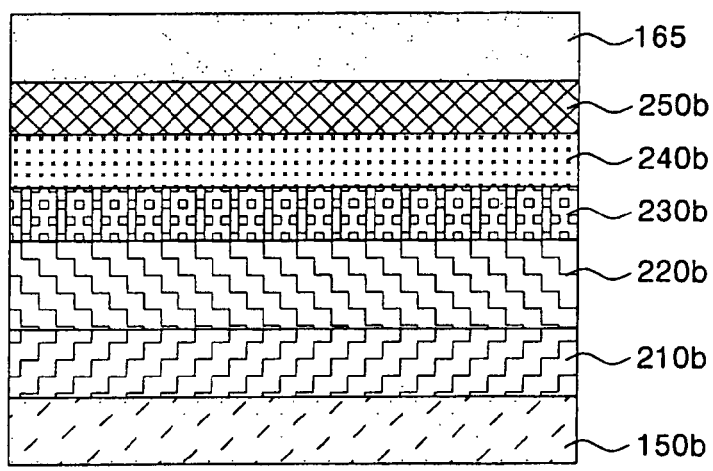
Figure 2C:
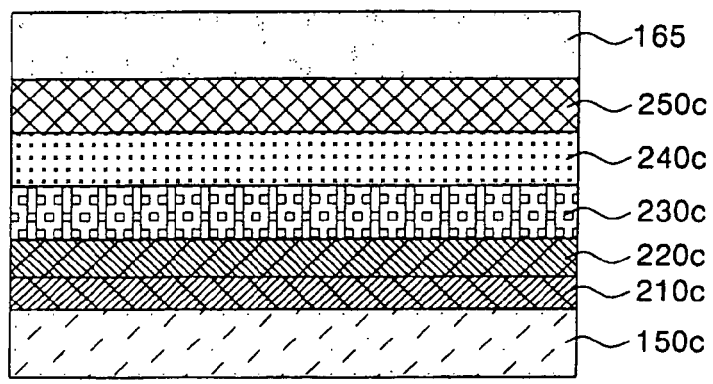

FIGS. 2A, 2B and 2C are schematic cross-sectional views illustrating structures formed in each of the pixel regions of the unit pixels. FIGS. 2A, 2B and 2C show the structures of the organic layer in the first, second and third pixel regions P1, P2, P3 in FIG. 1C.

Referring to FIGS. 2A, 2B and 2C, first organic layers 210a, 210b, 210c, second organic layers 220a, 220b, 220c, third organic layers 230a, 230b, 230c, fourth organic layers 240a, 240b, 240c and fifth organic layers 250a, 250b, 250c are sequentially stacked on the first electrodes 150a, 150b, 150c, respectively. The second electrode 165 is then formed on the fifth organic layers 250a, 250b, 250c.

Here, the first organic layers 210a, 210b, 210c may be HILs, the second organic layers 220a, 220b, 220c may be HTLs, the third organic layers 230a, 230b, 230c may be EMLs, the fourth organic layers 240a, 240b, 240c may be ETLs, and the fifth organic layers 250a, 250b, 250c may be EILs.

Here, although not shown in the schematic cross-sectional views of FIGS. 2A, 2B and 2C, hole blocking layers (HBLs) may be further formed between the third and fourth organic layers 230a, 230b, 230c and 240a, 240b, 240c, respectively.

Here, the combined thickness of the first organic layers 210a, 210b, 210c, i.e., the HILs, and the second organic layers 220a, 220b, 220c, i.e., the HTLs, may be designed to have appropriate values in the first, second and third pixel regions P1, P2, P3.

First, the luminous efficiencies may vary according to a resonance effect depending on the combined thickness of the first and second organic layers of each of the sub-pixels R, G and B. Table 1 shows a relationship between luminous efficiency (for colors R, G and B) and the combined thickness of the first and second organic layers.

TABLE 1

| Combined thickness of first and second organic layers | R efficiency | G efficiency | B efficiency | B CIE x | B CIE y |
|---|---|---|---|---|---|
| 100 | 1.2 | 1.7 | 0.4 | 0.12 | 0.06 |
| 200 | 0.8 | 2.21 | 0.51 | 0.13 | 0.07 |
| 300 | 1.1 | 2.73 | 0.65 | 0.14 | 0.09 |
| 400 | 1.16 | 2.3 | 0.69 | 0.14 | 0.12 |
| 500 | 2.02 | 1.94 | 0.72 | 0.15 | 0.14 |
| 600 | 2.56 | 1.43 | 0.78 | 0.15 | 0.15 |
| 700 | 1.98 | 1.22 | 0.84 | 0.15 | 0.17 |
| 800 | 1.23 | 1.1 | 0.9 | 0.16 | 0.19 |
| 900 | 1 | 1 | 1 | 0.16 | 0.2 |
| 1000 | 0.91 | 0.83 | 0.89 | 0.16 | 0.18 |
| 1100 | 0.83 | 1.39 | 0.76 | 0.15 | 0.17 |
| 1200 | 0.62 | 1.59 | 0.7 | 0.15 | 0.15 |
| 1300 | 1.01 | 1.86 | 0.62 | 0.14 | 0.1 |
| 1400 | 1.28 | 2.1 | 0.54 | 0.13 | 0.08 |
| 1500 | 1.32 | 2.31 | 0.41 | 0.12 | 0.06 |
| 1600 | 1.44 | 2.43 | 0.48 | 0.12 | 0.08 |
| 1700 | 1.65 | 2.49 | 0.52 | 0.14 | 0.11 |
| 1800 | 1.76 | 2.56 | 0.62 | 0.14 | 0.13 |
| 1900 | 1.79 | 2.43 | 0.76 | 0.15 | 0.16 |
| 2000 | 1.88 | 2.11 | 0.86 | 0.16 | 0.19 |
| 2100 | 2.17 | 1.99 | 0.7 | 0.15 | 0.17 |
| 2200 | 2.41 | 1.94 | 0.47 | 0.15 | 0.15 |
| 2300 | 2.26 | 1.73 | 0.32 | 0.14 | 0.13 |
| 2400 | 2.01 | 1.62 | 0.29 | 0.13 | 0.1 |
| 2500 | 1.74 | 1.28 | 0.25 | 0.13 | 0.08 |
| 2600 | 1.26 | 1.01 | 0.23 | 0.12 | 0.07 |

Referring to Table 1, for R and G, color characteristics are somewhat satisfied even if the thicknesses of the first and second organic layers are changed, so the most efficient thickness ranges, as shown in Table 1, are approximately 500-700 Å or approximately 2000-2400 Å for R and approximately 200-400 Å or approximately 1600-2000 Å for G. The most efficient thickness ranges are selected. As for B, after limiting color characteristics such that the y color coordinate is less than 0.09, the most efficient thickness ranges within the set limit are chosen, which are approximately 200 to 400 Å or approximately 1200 to 1600 Å.

Accordingly, the R sub-pixel may be formed when the first and second organic layers have a combined thickness of approximately 500 to 700 Å or approximately 2000 to 2400 Å, the G sub-pixel may be formed when the first and second organic layers have a combined thickness of approximately 200 to 400 Å or approximately 1600 to 2000 Å, and the B sub-pixel may be formed when the first and second organic layers have a combined thickness of approximately 200 to 400 Å or approximately 1200 to 1600 Å.

Figure 3A:
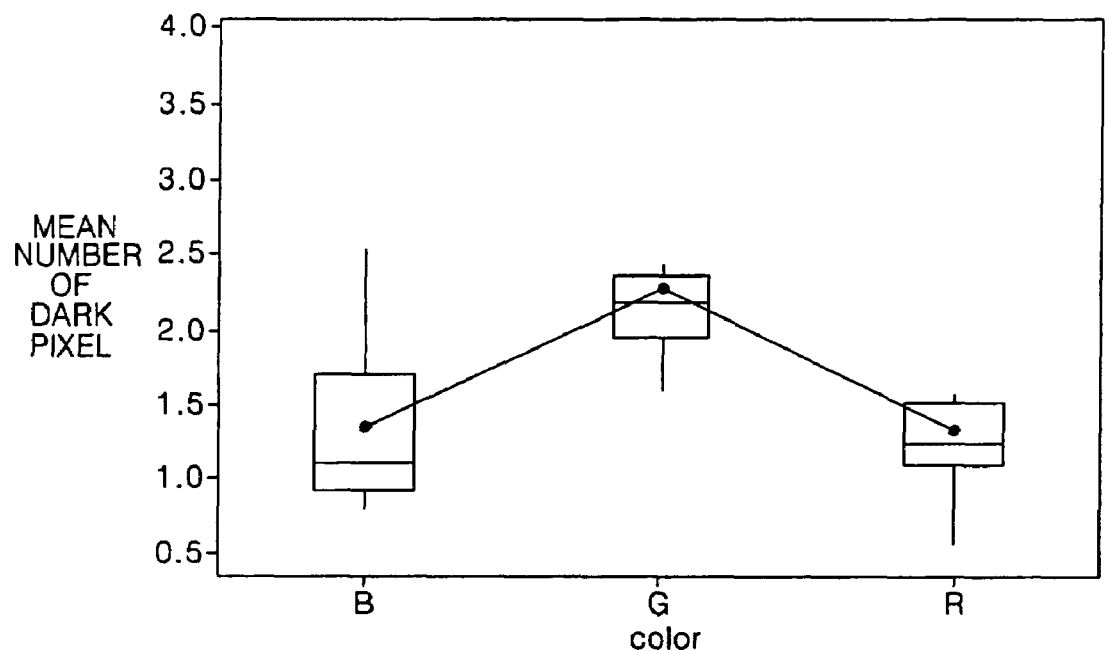
FIG. 3A is a graph showing the mean number of dark pixels for each of red (R), green (G) and blue (B) sub-pixels.
Figure 3B:
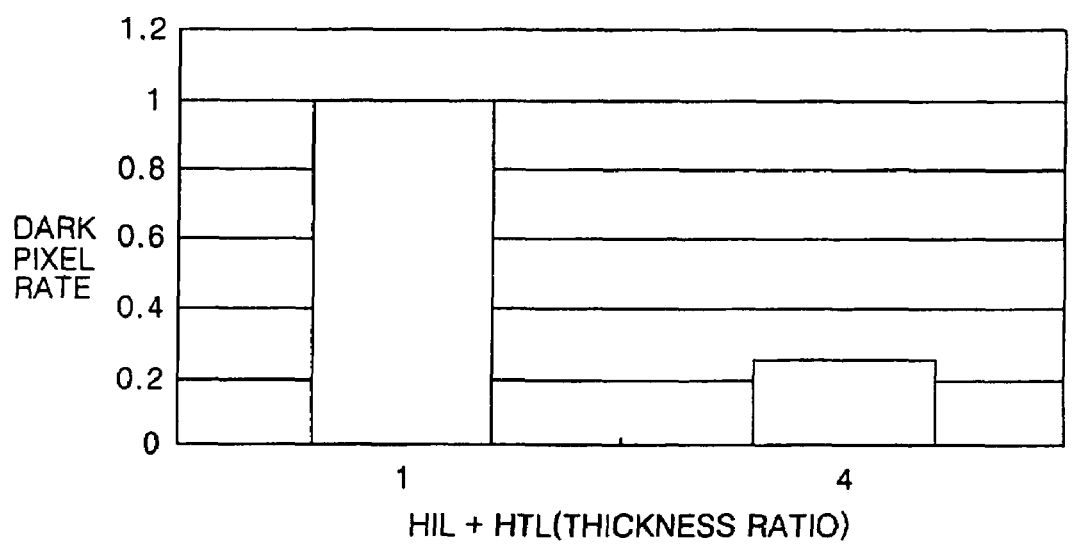
FIG. 3B is a chart showing a dark pixel rate versus the combined thickness of a first organic layer and a second organic layer of a green sub-pixel.

FIG. 3A is a graph showing the mean number of dark pixels for each of R, G and B sub-pixels. FIG. 3B is a chart showing a dark pixel rate versus the combined thickness of first and second organic layers of a G sub-pixel.

Referring to FIGS. 3A and 3B, the brightness for each color of sub-pixel is different to adjust the white balance of a unit pixel including three unified sub-pixels. For example, the brightness of G is the highest. When the white balance is adjusted by making the combined thickness of the first and second organic layers of the R, G and B sub-pixels equal, as shown in FIG. 3A, fewer dark pixels are generated in the B or R sub-pixels, whereas more dark pixels are generated in the green G sub-pixel having the highest brightness. It may be noted that, as shown in FIG. 3B, when the organic layers of the G sub-pixel satisfy resonance conditions and are formed to be fairly thick, dark pixels in the G sub-pixel are significantly reduced in number. Thus, the first and second organic layers of the G sub-pixel may be formed to be thick.

Figure 4A:
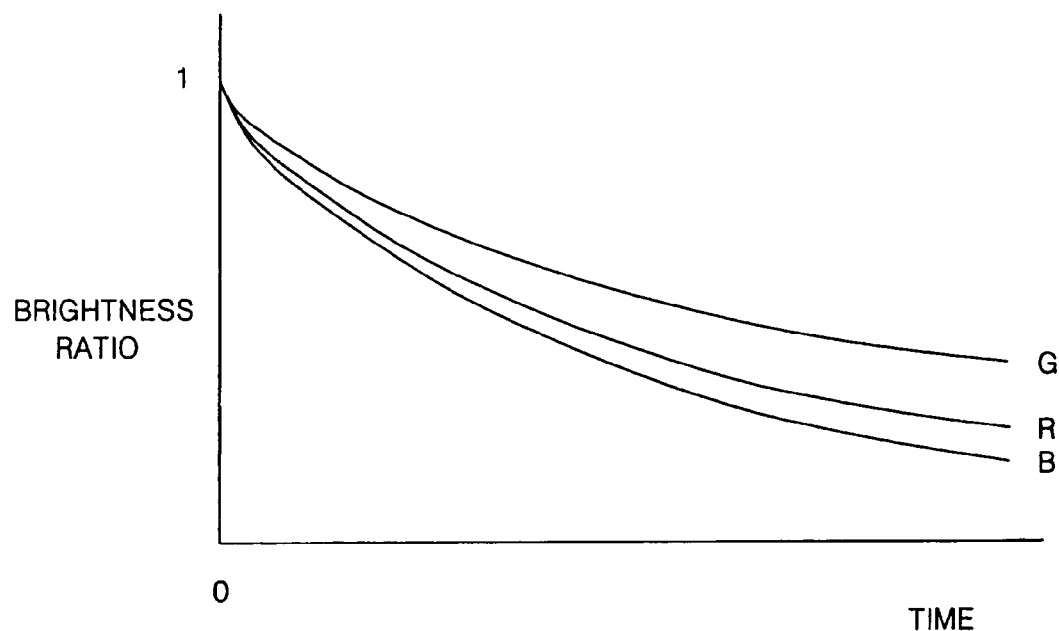
FIGS. 4A and 4B are graphs showing a brightness ratio versus time for each of R, G and B sub-pixels, and a luminescence ratio versus time for G and B sub-pixels, respectively.
Figure 4B:
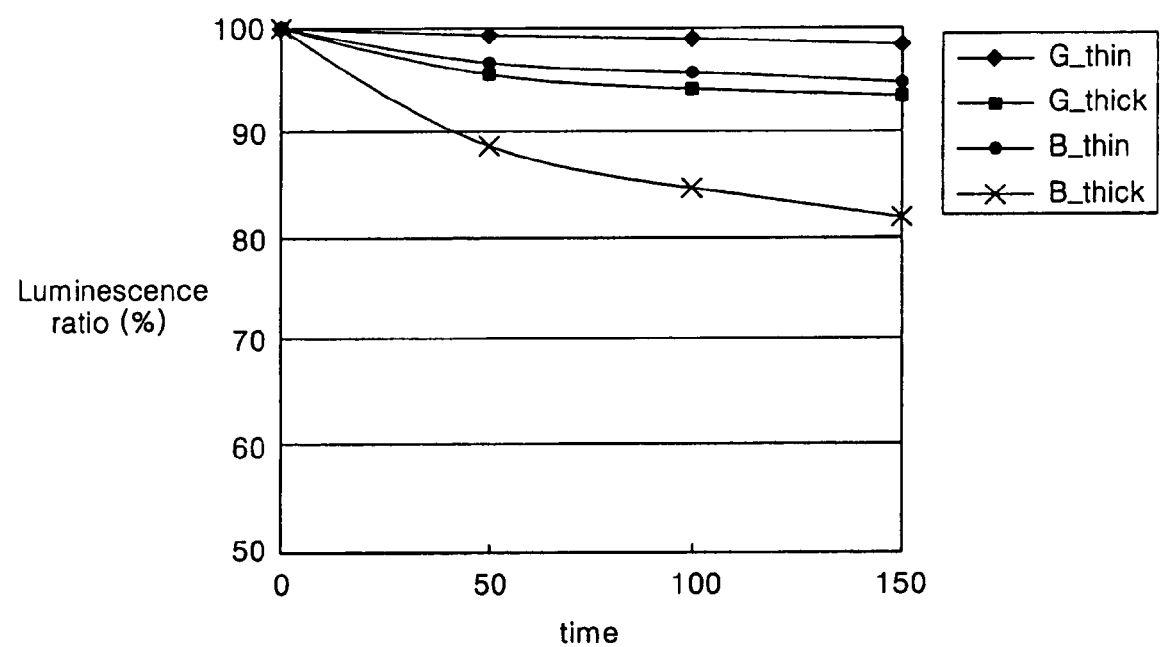

FIGS. 4A and 4B are graphs of a brightness ratio versus time for each of R, G and B sub-pixels, and a luminescence ratio versus time for G and B sub-pixels, respectively.

In one exemplary embodiment of the invention, the combined thickness of the first and second organic layers of the B sub-pixel is thin. However, referring to FIG. 4A, the B sub-pixel has the shortest lifespan, so its brightness decreases more quickly over time than other colors having different life-spans, and thereby a color shift occurs in which the blue color turns a greenish or yellowish color. In order to solve this problem, as shown in FIG. 4B, the first and second organic layers of the B sub-pixel are formed to be thin (B_thin curve), and the first and second organic layers of the G sub-pixel are formed to be thick (G_thick curve). Consequently, the lifespan of B may approach that of G.

Here, in FIG. 4A, the brightness ratios of R, G and B versus time are shown. In FIG. 4B, "G_thin" represents values of a luminescence ratio of G having thin first and second organic layers, "G_thick" represents values of the luminescence ratio of G having thick first and second organic layers, "B_thin" represents values of the luminescence ratio of B having thin first and second organic layers, and "B_thick" represents values of the luminescence ratio of B having thick first and second organic layers.

Thus, referring back to FIGS. 2A, 2B and 2C, the first and second organic layers 210b, 220b in the second pixel region displaying green are formed to be thick to avoid a short current between the first and second electrodes, which would reduce luminous efficiency and lifespan. On the other hand, the first and second organic layers 210c and 220c in the third pixel region displaying blue are formed to be thin because lifespan and luminous efficiency decreases as the combined thickness of the layers increases.

Here, even if the first and second organic layers 210a and 220a of the organic layer in the first pixel region displaying red are formed to be thin, dark pixels may not be generated. And, even if these layers are thick, neither lifespan nor efficiency decreases. Therefore, these layers are allowed to be thin or thick.

Thus, the first and second organic layers 210a and 220a in the first pixel region P1 may be formed to a combined thickness of approximately 500 to 700 Å or approximately 2000 to 2400 Å, the first and second organic layers 210b and 220b in the second pixel region P2 may be formed to a combined thickness of approximately 1600 to 2000 Å, and the first and second organic layers 210c and 220c in the third pixel region P3 may be formed to a combined thickness of approximately 200 to 400 Å.

Here, the first pixel region P1 may include the R sub-pixel, the second region P2 may include the G sub-pixel, and the third pixel region P3 may include the B sub-pixel.

FIGS. 5A, 5B, 5C, 5D, 5E and 5F are cross-sectional views illustrating a method of forming organic layers of each sub-pixel according to an exemplary embodiment of the invention.

Figure 5A:
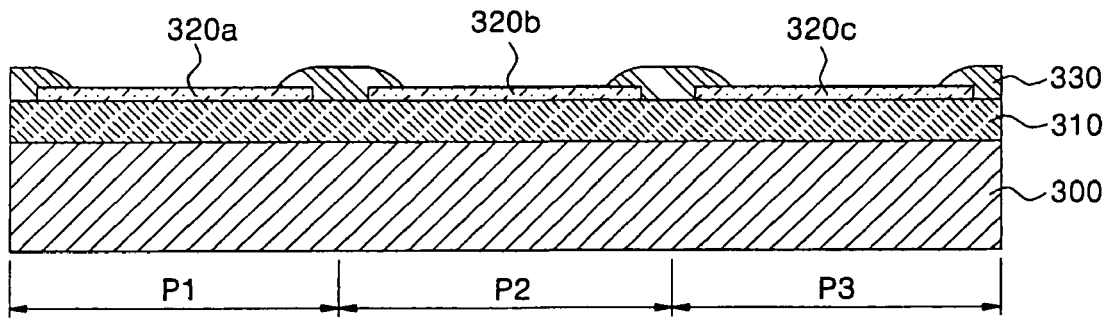
FIGS. 5A, 5B, 5C, 5D, 5E and 5F are cross-sectional views illustrating a method of forming organic layers of each sub-pixel according to an exemplary embodiment of the invention.

Referring to FIG. 5A, several element layers 310 are formed on a substrate 300. In some embodiments, the substrate 300 may be a transparent insulating substrate. Similar to the substrate 100 described with reference to FIGS. 1A and 1B, the substrate 300 may be formed of glass or plastic.

A first sub-pixel electrode 320a, a second sub-pixel electrode 320b, and a third sub-pixel electrode 320c are coupled to source/drain electrodes of the element layers 310 formed in first, second and third pixel regions P1, P2, P3, respectively. A pixel defining layer 330 is formed to expose predetermined regions of the first, second and third sub-pixel electrodes 320a, 320b, 320c.

Figure 5B:
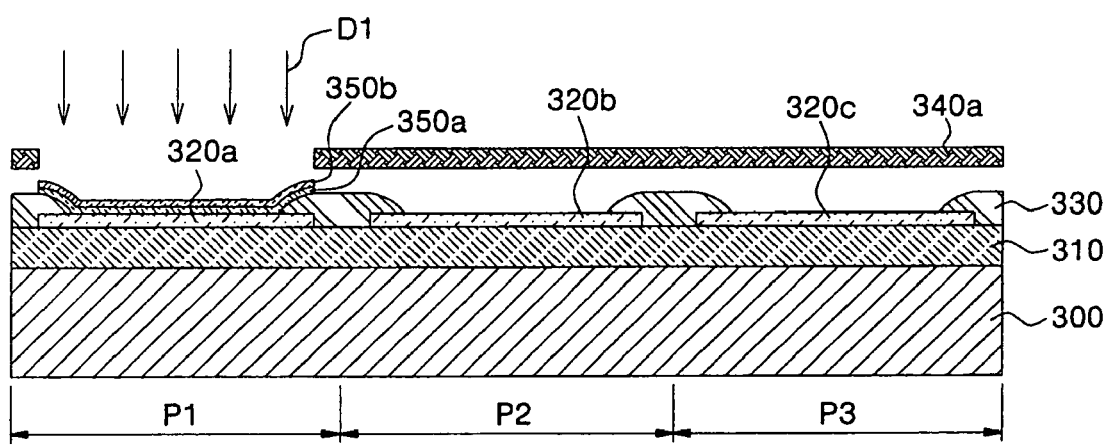

Further, referring to FIG. 5B, a first mask 340a is disposed over the substrate 300, and first and second organic layers 350a, 350b are deposited (D1) to a combined thickness of approximately 500 to 700 Å or approximately 2000 to 2400 Å on the first sub-pixel electrode 320a in the first pixel region.

Figure 5C:
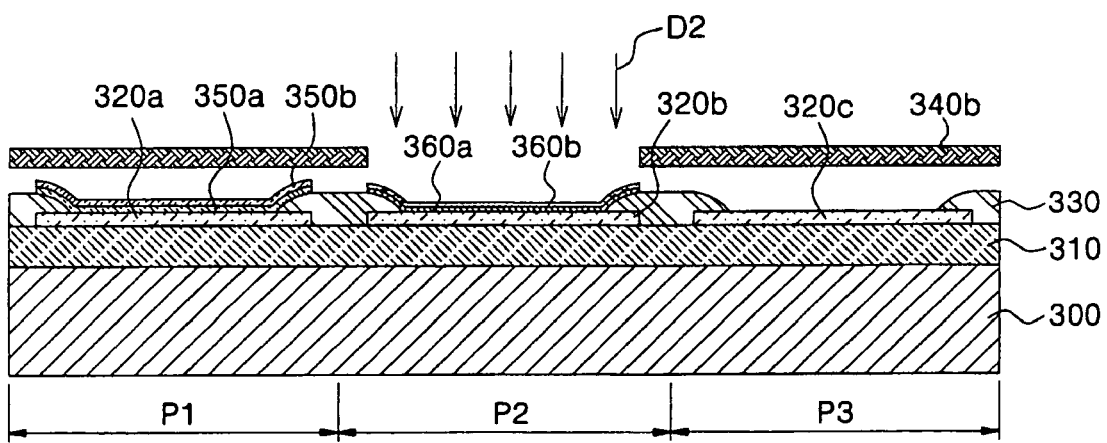

Referring to FIG. 5C, a second mask 340b is disposed over the substrate 300, and then first and second organic layers 360a, 360b are deposited (D2) to a combined thickness of approximately 1600 to 2000 Å on the second sub-pixel electrode 320b in the second pixel region P2.

Figure 5D:
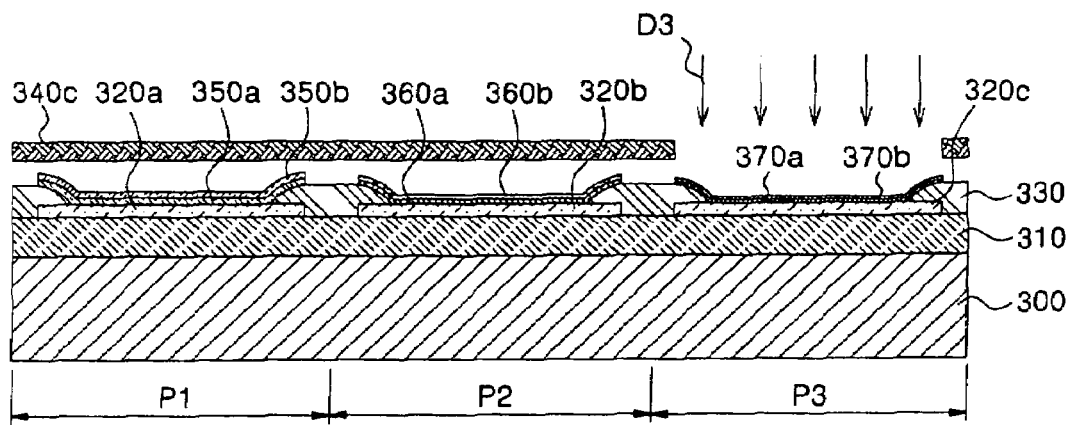

Referring to FIG. 5D, a third mask 340c is disposed over the substrate 300, and then first and second organic layers 370a, 370b are deposited (D3) to a combined thickness of approximately 200 to 400 Å on the third sub-pixel electrode 320c in the third pixel region P3.

Figure 5E:
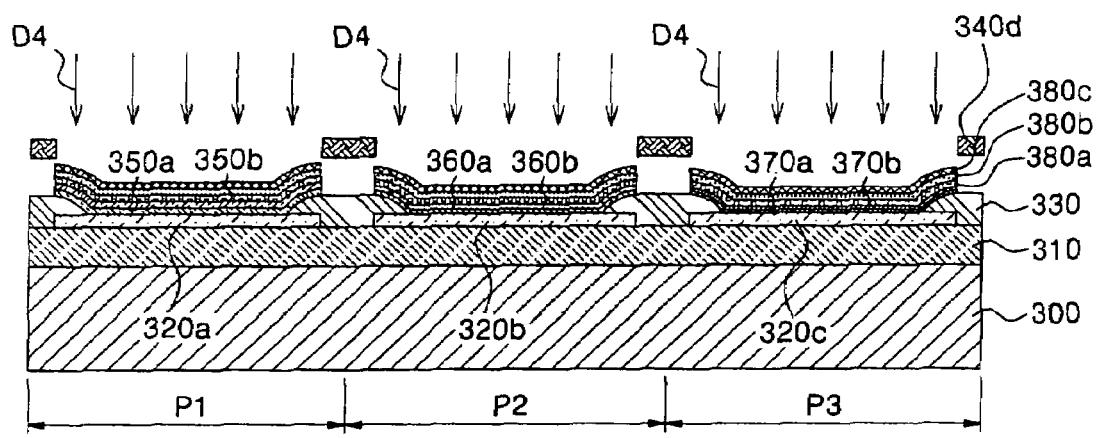

Referring to FIG. 5E, a fourth mask 340d is disposed over the substrate 300, and then the combined third, fourth and fifth organic layers 380a, 380b and 380c are sequentially deposited (D4) on each of the first sub-pixel electrode 320a, the second sub-pixel electrode 320b and the third sub-pixel electrode 320c, respectively, of the pixel regions P1, P2, P3.

Figure 5F:
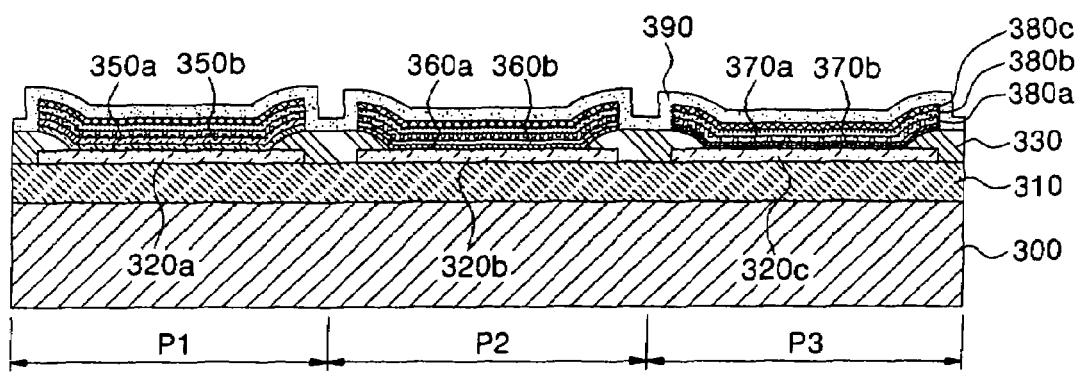

Referring to FIG. 5F, a second electrode 390 is formed in the first, second and third pixel regions P1, P2, P3 to complete the formation of an organic light emitting display device in which the first and second organic layers 350a and 350b are formed to a combined thickness of approximately 500 to 700 Å or approximately 2000 to 2400 Å in the first pixel region P1, the first and second organic layers 360a and 360b are formed to a combined thickness of approximately 1600 to 2000 Å in the second pixel region P2, the first and second organic layers 370a and 370b are formed to a combined thickness of approximately 200 to 400 Å in the third pixel region P3, and the third, fourth and fifth organic layers 380a, 380b, 380c are formed to have the same thicknesses on top of the first and second organic layers across P1, P2, P3.

FIGS. 6A, 6B, 6C, 6D and 6E are cross-sectional views illustrating a method of forming organic layers of each sub-pixel according to another exemplary embodiment of the invention.

Figure 6A:
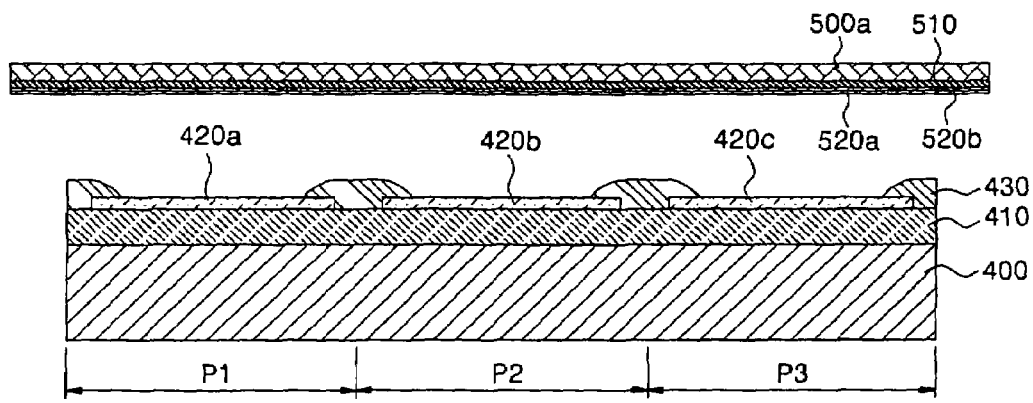
FIGS. 6A, 6B, 6C, 6D and 6E are cross-sectional views illustrating a method of forming organic layers of each sub-pixel according to another exemplary embodiment of the invention.

Referring to FIG. 6A, several element layers 410 are formed on a substrate 400. In some embodiments, the substrate 400 may be a transparent insulating substrate. Similar to the substrate 100 described with reference to FIGS. 1A and 1B, the substrate may be formed of glass or plastic.

A first sub-pixel electrode 420a, a second sub-pixel electrode 420b and a third sub-pixel electrode 420c are formed on element layer 410 to contact source/drain electrodes of the element layers 410.

A pixel defining layer 430 is formed to expose predetermined regions of the sub-pixel electrodes 420a, 420b, 420c.

A light-heat conversion layer 510 and a first donor film 500a, which is formed of a first donor-first organic film 520a and a first donor-second organic film 520b having a combined thickness of approximately 200 to 400 Å, are disposed on the substrate 400.

Figure 6B:
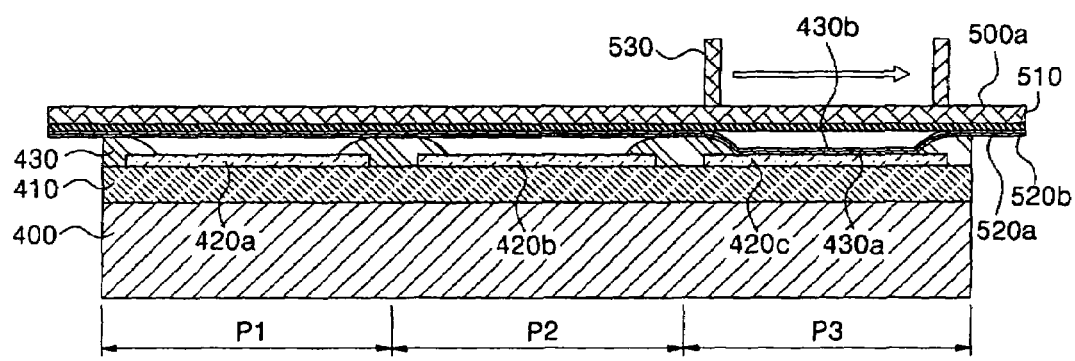

Referring to FIG. 6B, after the first donor film 500a is made to contact the substrate 400, a laser 530 is radiated at a predetermined distance to transfer parts of the first donor-first organic film 520a and the first donor-second organic film 520b onto the third sub-pixel electrode 420c in the third pixel region P3 to form first and second organic layers 430a and 430b in the third pixel region P3. Here, since light energy of the laser 530 is transformed into heat energy in the light-heat conversion layer 510 and parts of the first donor-first organic film 520a and first donor-second organic film 520b are separated from the first donor film 500a, the first donor-first organic film 520 and the first donor-second organic film 520b formed on the first donor film 500a are transferred onto the third sub-pixel electrode 420c.

Then, the first donor film 500a is removed from the substrate 400.

Figure 6C:
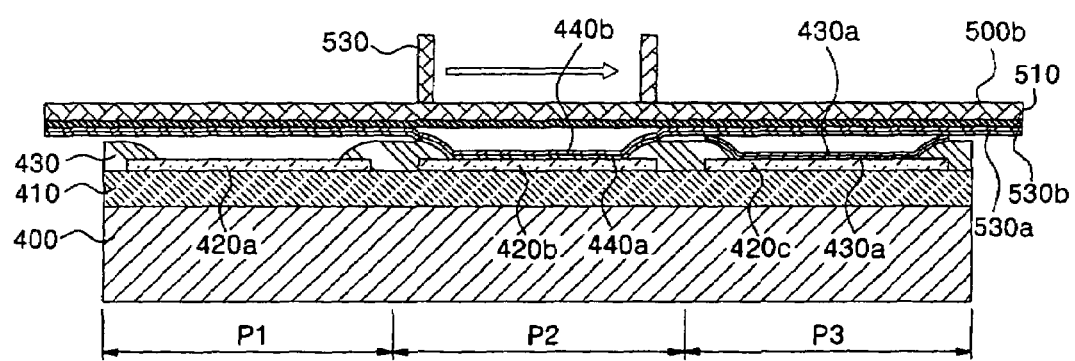

Referring to FIG. 6C, after making a second donor film 500b, which is composed of a second donor-first organic film 530a and a second donor-second organic film 530b, contact the substrate 400, the laser 530 is radiated at a predetermined distance to form first and second organic layers 440a and 440b having a combined thickness of approximately 1600 to 2000 Å in the second pixel region P2.

Figure 6D:
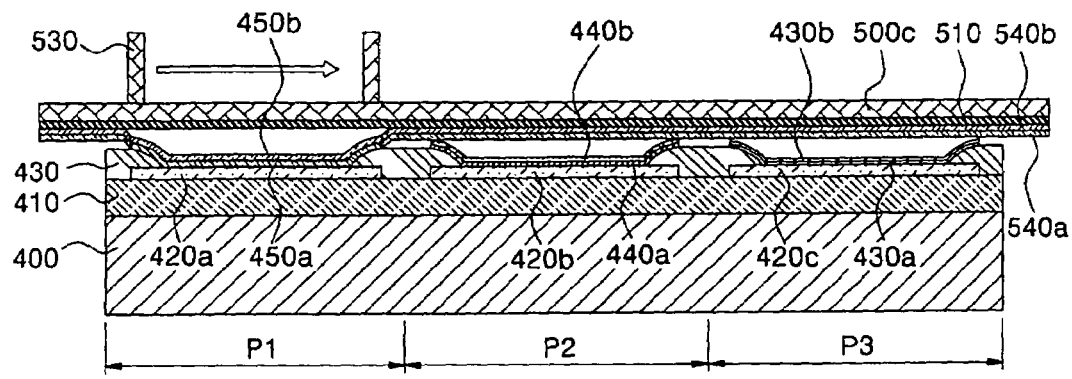

Referring to FIG. 6D, after making a third donor film 500c, which is composed of a third donor-first organic film 540a and a third donor-second organic film 540b, contact the substrate 400, the laser 530 is radiated at a predetermined distance to form first and second organic layers 450a and 450b having a combined thickness of approximately 500 to 700 Å or approximately 2000 to 2400 Å in the first pixel region P1.

Figure 6E:
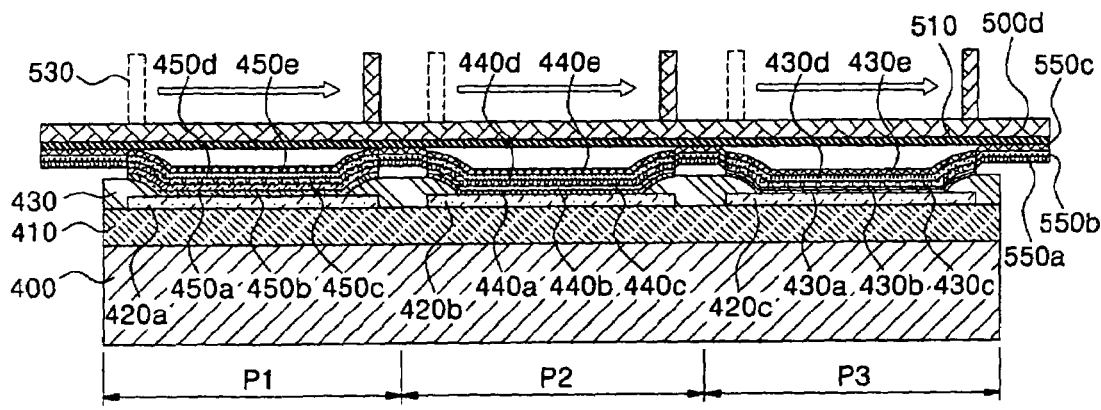

Referring to FIG. 6E, after making a fourth donor film 500d formed of a fourth donor-third organic film 550a, a fourth donor-fourth organic film 550b, and a fourth donor-fifth organic film 550c contact the substrate 400, the laser 530 is radiated at a predetermined distance to form third organic layers 450c, 440c and 430c, fourth organic layers 450d, 440d and 430d, and fifth organic layers 450e, 440e and 430e in the first, second and third pixel regions P1, P2, P3, respectively.

Here, the third, fourth and fifth organic layers formed in the respective pixel regions have the same thickness.

Then, a second electrode (not illustrated) is formed on the substrate 400 and an organic light emitting display device is completed.

According to the present invention, an organic light emitting display device and a method of fabricating the same are provided.

While numerous embodiments of the present invention have been described herein, it will be apparent to those of ordinary skill in the art that various modifications in form and detail can be made to the described embodiments without departing from the spirit and scope of the present invention as defined by the appended claims and their equivalents.

What is claimed is:

1. An organic light emitting display device, comprising:
a substrate having a first pixel region, a second pixel region and a third pixel region;
a first electrode disposed on the substrate;
an organic emission layer disposed on the first electrode;
a second electrode disposed on the organic emission layer; and
a first organic layer and a second organic layer disposed between the first electrode and the organic emission layer,
wherein the first organic layer and the second organic layer have a combined thickness of approximately 500 to 700 Å or 2000 to 2400 Å in the first pixel region, a combined thickness of approximately 1600 to 2000 Å in the second pixel region, and a combined thickness of approximately 200 to 400 Å in the third pixel region.

2. The organic light emitting display device according to claim 1, wherein the first organic layer is a hole injection layer and the second organic layer is a hole transport layer.

3. The organic light emitting display device according to claim 1, wherein the first pixel region is adapted to display red.

4. The organic light emitting display device according to claim 1, wherein the second pixel region is adapted to display green.

5. The organic light emitting display device according to claim 1, wherein the third pixel region is adapted to display blue.

6. A method of fabricating an organic light emitting display device, the method comprising:
forming a plurality of first electrodes on a substrate;
defining a first pixel region, a second pixel region and a third pixel region on the substrate;
forming a first organic layer and a second organic layer, the first organic layer and the second organic layer having a combined thickness of approximately 500 to 700 Å or approximately 2000 to 2400 Å in the first pixel region, having a combined thickness of approximately 1600 to 2000 Å in the second pixel region, and having a combined thickness of approximately 200 to 400 Å in the third pixel region;
forming an emission layer on the substrate on which the first pixel region, the second pixel region and the third pixel region are defined; and
forming a second electrode on the emission layer.

7. The method according to claim 6, further comprising forming at least one of a hole blocking layer, an electron transport layer or an electron injection layer on the emission layer prior to forming the second electrode.

8. The method according to claim 6, wherein said forming the first organic layer and the second organic layer, comprises:
forming the first organic layer and the second organic layer in the first pixel region using a first mask;
forming the first organic layer and the second organic layer in the second pixel region using a second mask; and
forming the first organic layer and the second organic layer in the third pixel region using a third mask.

9. The method according to claim 8, wherein the first organic layer is a hole injection layer and the second organic layer is a hole transport layer.

10. The method according to claim 6, wherein said forming the first organic layer and the second organic layer, comprises:
disposing a first donor film having a light-heat conversion layer and a first transfer layer on the substrate;
forming the first organic layer and the second organic layer in the third pixel region using a heat transfer method;
disposing a second donor film having the light-heat conversion layer and a second transfer layer on the substrate;
forming the first organic layer and the second organic layer in the second pixel region using the heat transfer method;
disposing a third donor film having the light-heat conversion layer and a third transfer layer on the substrate; and
forming the first organic layer and the second organic layer in the first pixel region using the heat transfer method.

11. The method according to claim 10, wherein the first organic layer is a hole injection layer and the second organic layer is a hole transport layer.

12. An organic light emitting display device, comprising:
a substrate having a first pixel region, a second pixel region and a third pixel region;
a plurality of first electrodes, each of the first electrodes being disposed on the first pixel region, the second pixel region or the third pixel region;
a plurality of organic emission layers, each of the organic emission layers being disposed on a corresponding one of the first electrodes;
a second electrode disposed on the organic emission layers;

a first organic layer and a second organic layer having a combined thickness of approximately 500 to 700 Å or approximately 2000 to 2400 Å and disposed in the first pixel region;

a third organic layer and a fourth organic layer having a combined thickness of approximately 1600 to 2000 Å and disposed in the second pixel region; and a fifth organic layer and a sixth organic layer having a combined thickness of approximately 200 to 400 Å and disposed in the third pixel region.

13. The organic light emitting display device according to claim 12, wherein the first electrodes are anode electrodes, and the second electrode is a cathode electrode.

14. The organic light emitting display device according to claim 12, wherein the first, third and fifth organic layers are hole injection layers and the second, fourth and sixth organic layers are hole transport layers.

15. The organic light emitting display device according to claim 14, further comprising an electron injection layer and an electron transport layer disposed between the second electrode and each of the organic emission layers.

16. The organic light emitting display device according to claim 12, wherein the first pixel region is adapted to display red, the second pixel region is adapted to display green, and the third pixel region is adapted to display blue.

* * * * *